United States Patent [19]
Maki

[11] Patent Number: 6,104,327
[45] Date of Patent: Aug. 15, 2000

[54] INTERFACE CIRCUIT FOR SERIAL D-A CONVERTER

[75] Inventor: Takashi Maki, Kanagawa, Japan

[73] Assignee: Ricoh Company, Ltd., Tokyo, Japan

[21] Appl. No.: 09/099,608

[22] Filed: Jun. 18, 1998

[30] Foreign Application Priority Data

Jun. 27, 1997 [JP] Japan .................................. 9-171587

[51] Int. Cl.$^7$ .................................................. H03M 9/00
[52] U.S. Cl. .......................................... 341/101; 341/144
[58] Field of Search ................................ 341/100, 101, 341/144

[56] References Cited

U.S. PATENT DOCUMENTS

| | | | |
|---|---|---|---|
| 5,319,369 | 6/1994 | Majos et al. | 341/101 |
| 5,541,596 | 7/1996 | Yoshida | 341/100 |
| 5,563,594 | 10/1996 | Ford et al. | 341/100 |
| 5,629,696 | 5/1997 | Kawasaki et al. | 341/101 |

FOREIGN PATENT DOCUMENTS

| | | |
|---|---|---|
| 62-81165 | 12/1987 | Japan . |
| 63-18476 | 1/1988 | Japan . |
| 4-10285 | 1/1992 | Japan . |

*Primary Examiner*—Howard L. Williams
*Assistant Examiner*—Jean B. Jeanglaude
*Attorney, Agent, or Firm*—Cooper & Dunham LLP

[57] ABSTRACT

An interface circuit is used for a serial D-A converter, the serial D-A converter having a digital signal in a form of serial data input thereto and determining a piece of data of the digital signal in the form of serial data defined by a point of change of a control signal as data to be converted into an analog signal. The interface circuit includes: a converting portion converting an input digital signal in a form of parallel data into the digital signal in the form of serial data to be input to the serial D-A converter; a specifying portion specifying the number of bits per piece of the data of the digital signal in the form of serial data, the piece of the data of the digital signal in the form of serial data being data to be converted into the analog data by the serial D-A converter; and a phase control portion changing the phase of the control signal in accordance with the number of bits specified by the specifying portion.

6 Claims, 9 Drawing Sheets

FIG. 8B

| OUTPUT BIT WIDTH | SEL 0 | SEL 1 |
|---|---|---|
| 16 BITS | 0 | 0 |
| 18 BITS | 1 | 0 |
| 20 BITS | 0 | 1 |

INTERFACE CIRCUIT FOR SERIAL D-A CONVERTER

BACKGROUND OF THE INVENTION

1. Field of the Invention

The present invention relates to an interface circuit for a serial digital-to-analog converter (hereinafter, simply referred to as a 'serial D-A converter') used in an LSI (Large-Scale Integrated) circuit for audio or the like.

2. Description of the Related Art

In order to convert parallel data generated by a signal generating system as a digital signal into an analog signal through a serial D-A converter, an interface circuit for performing parallel-to-serial conversion is needed between the signal generating system and the serial D-A converter. In a case where the bit width of the parallel data generated by the signal generating circuit is larger than the bit width which can be processed by the serial D-A converter having a processing resolution, it is necessary to cause the bit width per piece of serial data output from the interface circuit as data to be converted into analog data through the serial D-A converter (hereinafter, simply referred to as an 'output bit width') to fit the processing resolution of the serial D-A converter. For this purpose, it is required that, in the interface circuit, the necessary number of bits, starting from the most significant bit, are selected from the parallel data in accordance with the resolution of the serial D-A converter to be used, the selected bits of the parallel data being converted into the serial data to be output. Thereby, it is possible to use serial D-A converters, having various resolutions, with the interface circuit. Thus, it is possible to widely respond to demands for the cost and performance of the entire system. For example, in a case where the signal generating system generates parallel data of 20 bits whereas the resolution of 16 bits is necessary and sufficient for the demand of the performance of the entire system, an inexpensive serial D-A converter can be used as a result of causing the output bit width of the interface circuit to be 16. In a case where the resolution of 20 bits is required for the performance of the entire system, the output bit width of the interface circuit is caused to be 20 and a high-performance serial D-A converter may be used.

As a method of the parallel-to-serial conversion needed in such an interface circuit, a method in which, after the parallel data is loaded in a shift register, the loaded data is output in a serial form as a result of a clock signal being input to the shift register is a general method. FIG. 1 is a block diagram showing an arrangement of an interface circuit in the related art based on the above-mentioned method. This interface circuit includes a shift register 106 for converting the parallel data from the signal generating system into the serial data, a frequency divider 110 for generating a load signal LOAD to be supplied to the shift register 106 and control signals (a word clock signal WCLK and an LR clock signal LRCK) to be supplied to the serial D-A converter, and a load signal generator 112.

The interface circuit shown in FIG. 1 further includes a bit-width specifying register 108 for specifying the output bit width in order to select the necessary number of bits starting from the most significant bit from the parallel data so that the selected bits of data in the form of serial data are output. Further, the interface circuit includes a register 102 for temporarily storing the parallel data supplied from the signal generating system, and a shifter 104 between the register 102 and the shift register 106. In this interface circuit, a value specifying the output bit width is previously set in the bit-width specifying register 108. In a case where the bit width of the input parallel data is larger than the output bit width, the data in the register 102 is shifted by the shifter 104 in accordance with the value set in the bit-width specifying register 108. The data obtained as a result of the data in the register 102 being shifted by the shifter 104 is loaded in the shift register 106. After the loading, the loaded data is output from the shift register 106 as the serial data DATA in timing of the bit clock signal BCLK supplied to the shift register 106. The number of bits per piece of the serial data (output bit width) is caused to be the bit width specified by the bit-width specifying register 108 as a result of the above-mentioned shifting being performed by the shifter 104.

FIG. 2 is a timing chart showing operations of the above-described interface circuit. In the example shown in FIG. 2, '2×', '4×', . . . , '64×' are a twice signal (the signal has twice the period), a four-times signal (the signal has four times the period), . . . , 64-times signal (the signal has 64 times the period), respectively. These signals are obtained as a result of the bit clock signal BCLK undergoing frequency division performed by the frequency divider 110. The 32-times signal '32×' and the 64-times signal '64×' are input to the serial D-A converter as the word clock signal WCLK and the LR clock signal LRCK, respectively. Further, in this example, it is assumed that the bit width of the parallel data is 20. DATA20, DATA18 and DATA16 shown in FIG. 2 are the signals of the serial data DATA output from the interface circuit in cases where '20', '18' and '16' are specified by the bit-width specifying register 108 as the output bit widths, respectively. In this interface circuit, the parallel data temporarily stored in the register 102 is loaded in the shift register 106 via the shifter 104 at a timing of the load signal LOAD. At this time, in the case where '20' is specified as the output bit width, the data is loaded in the shift register without undergoing shifting. However, in a case where a value smaller than 20 is specified as the output bit width, the data is shifted in the direction of the least significant bit (LSB) in accordance with the specified value, and the bits of '0' are inserted before the most significant bit (MSB), the number of the bits '0' to be inserted being equal to the number of bits by which the data is shifted, as shown in FIG. 2.

A circuit for performing such a shifting operation includes, as shown in FIG. 3A, selectors each including AND gates and an OR gate. The shifter having the arrangement shown in FIG. 3A is used for outputting the data having any one of the three output bit widths: 16, 18 and 20. In this shifter, shifting by the number of bits determined by selecting signals SEL0 and SEL1 which have values in accordance with the value set in the bit-width specifying register 108 is performed. Specifically, in the case where '16' is selected as the output bit width, SEL0=SEL1=0, as shown in FIG. 3B, and, thereby, the shifting of the data by 4 bits in the direction of the least significant bit is performed. In the case where '18' is selected as the output bit width, SEL0=1 and SEL1=0, and, thereby, the shifting of the data by 2 bits in the direction of the least significant bit is performed. In the case where '20' is selected as the output bit width, SEL0=0 and SEL1=1, and, thereby, no shifting operation is performed.

In the case where adjusting of the output bit width is performed through the shifter such as that shown in FIG. 3A, it is necessary to provide the selector (including the AND gates and OR gate) for each data bit in the shifter. In a case of the interface circuit for the serial D-A converter for audio, for example, because audio data has a bit width on the order of 16 bits to 20 bits in general, it is necessary to provide the selector for this range of the bit width for each data bit. As a result, the circuit scale of the shifter is large.

SUMMARY OF THE INVENTION

An object of the present invention is to provide an interface circuit for a serial D-A converter in which the output bit width can be adjusted with a smaller circuit scale.

An interface circuit for a serial D-A converter according to the present invention, the serial D-A converter having a digital signal in a form of serial data input thereto and determining a piece of data of the digital signal in the form of serial data defined by a point of a change of a control signal as data to be converted into an analog signal, comprises:

a converting portion converting an input digital signal in a form of parallel data into the digital signal in the form of serial data to be input to the serial D-A converter;

a specifying portion specifying the number of bits per piece of the data of the digital signal in the form of serial data, the piece of the data of the digital signal in the form of serial data being data to be converted into the analog data by the serial D-A converter; and a phase control portion changing the phase of the control signal in accordance with the number of bits specified by the specifying portion.

In this arrangement, in accordance with the number of bits specified by the specifying portion, the phase of the control signal to be input to the serial D-A converter is changed. Thereby, the number of bits per piece of the data of the digital signal to be converted into the analog signal by the serial D-A converter is caused to be the number of bits specified by the specifying portion. As a result, it is possible to substantially adjust the output bit width of the interface circuit without using the shifter. Thus, the output bit width can be adjusted with a smaller circuit scale.

The interface circuit may further comprise a frequency dividing portion performing frequency division on the clock signal so as to generate at least one signal, the phase control portion changing the phase of the control signal, using the at least one signal obtained as a result of the bit clock signal undergoing frequency division performed by the frequency dividing portion, based on the number of bits specified by the specifying portion.

In this arrangement, the phase control portion controls the phase of the control signal using the signal obtained as a result of the bit clock signal undergoing frequency division performed by the frequency dividing portion. However, as shown in FIG. 1, the frequency dividing portion (frequency divider) is also provided in the interface circuit for a serial D-A converter in the related art. In the related art, the control signals are generated as a result of the bit clock signal undergoing frequency division. Accordingly, the interface circuit for a serial D-A converter according to the present invention can be formed as a result of only the phase control portion being added to the interface circuit for a serial D-A converter in the related art, the phase control portion enabling substantial adjustment of the output bit width.

The frequency dividing portion may generate at least one long-period clock signal and at least one short-period clock signal, half of the period of the at least one short-period clock signal corresponding to the number of bits specified by the specifying portion; and the phase control portion may latch the at least one long-period clock signal at an edge of the at least one short-period clock signal so as to generate the control signal, the phase of the control signal being delayed by the half of the period of the at least one short-period clock signal, the thus-generated control signal being supplied to the serial D-A converter.

In this arrangement, it is possible to provide the phase control portion having a simple arrangement.

Other objects and further features of the present invention will become more apparent from the following detailed description when read in conjunction with the accompanying drawings.

BRIEF DESCRIPTIONS OF THE DRAWINGS

FIG. 8B shows values of selecting signals set for values set as an output bit width.

DETAILED DESCRIPTIONS OF THE PREFERRED EMBODIMENT

Figure 4:
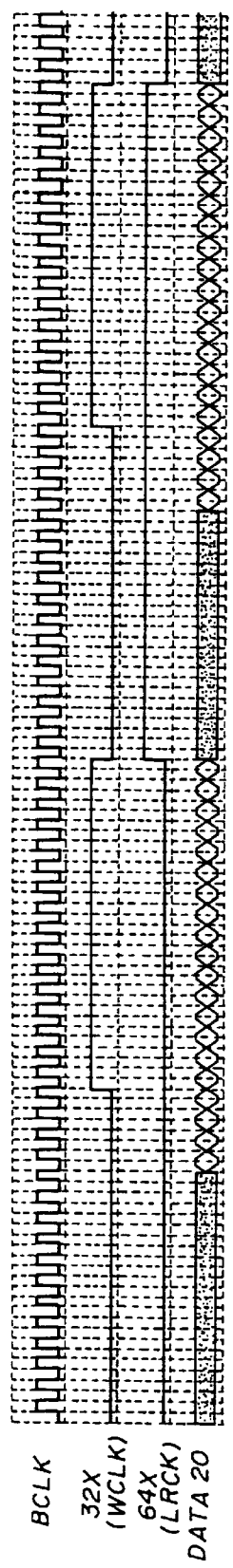
FIG. 4 is a timing chart showing an input format of a general serial D-A converter for audio.

The interface at the input side of the generally used serial D-A converter for audio includes, as shown in FIG. 4, 3 wires for inputting the serial data DATA 20, the bit block signal BCLK and the LR clock signal LRCK, or 4 wires for further inputting the word clock signal WCLK (where, in a case where the number of bits per piece of the serial data which is data to be converted into an analog signal through the serial D-A converter, that is, the number of bits constituting one word, is 'i', the signal of this serial data is referred to as 'DATA i'). Each piece of the serial data is input to the serial D-A converter bit by bit sequentially from the MSB (Most Significant Bit). Then, at the time when a subsequent change in level of the LR clock signal LRCK or the word clock signal WCLK (in the case of using the word clock signal WCLK, the subsequent decaying edge of the signal, whereas, in the case of using the LR signal LRCK, either of the subsequent rising edge and the subsequent decaying edge of the signal) occurs, it is determined that the LSB (Least Significant Bit) is input to the serial D-A converter. Thus, it is determined that one word has been completely input to the serial D-A converter. The bits of data input to the serial D-A converter from the time immediately after it has been determined that one word has been completely input through the time immediately before the MSB of the subsequent one word is input are determined to be data out of the range of the effective data. Actually, the serial D-A converter includes holding means for holding a predetermined number of bits, the number corresponding to the resolution of the serial D-A converter. During the operation of the serial D-A converter, the holding means always receives the serial data at a timing of the bit clock signal BCLK, and thus, holds the predetermined number of bits of the latest data. Then, at each time when the above-mentioned change in level of the LR clock signal LRCK or the word clock signal WCLK is detected, the data which has been received by this time in the holding means is treated as effective data to be converted into an analog signal. In such an arrangement, recognition of the MSB in the input data is not needed.

Figure 1:
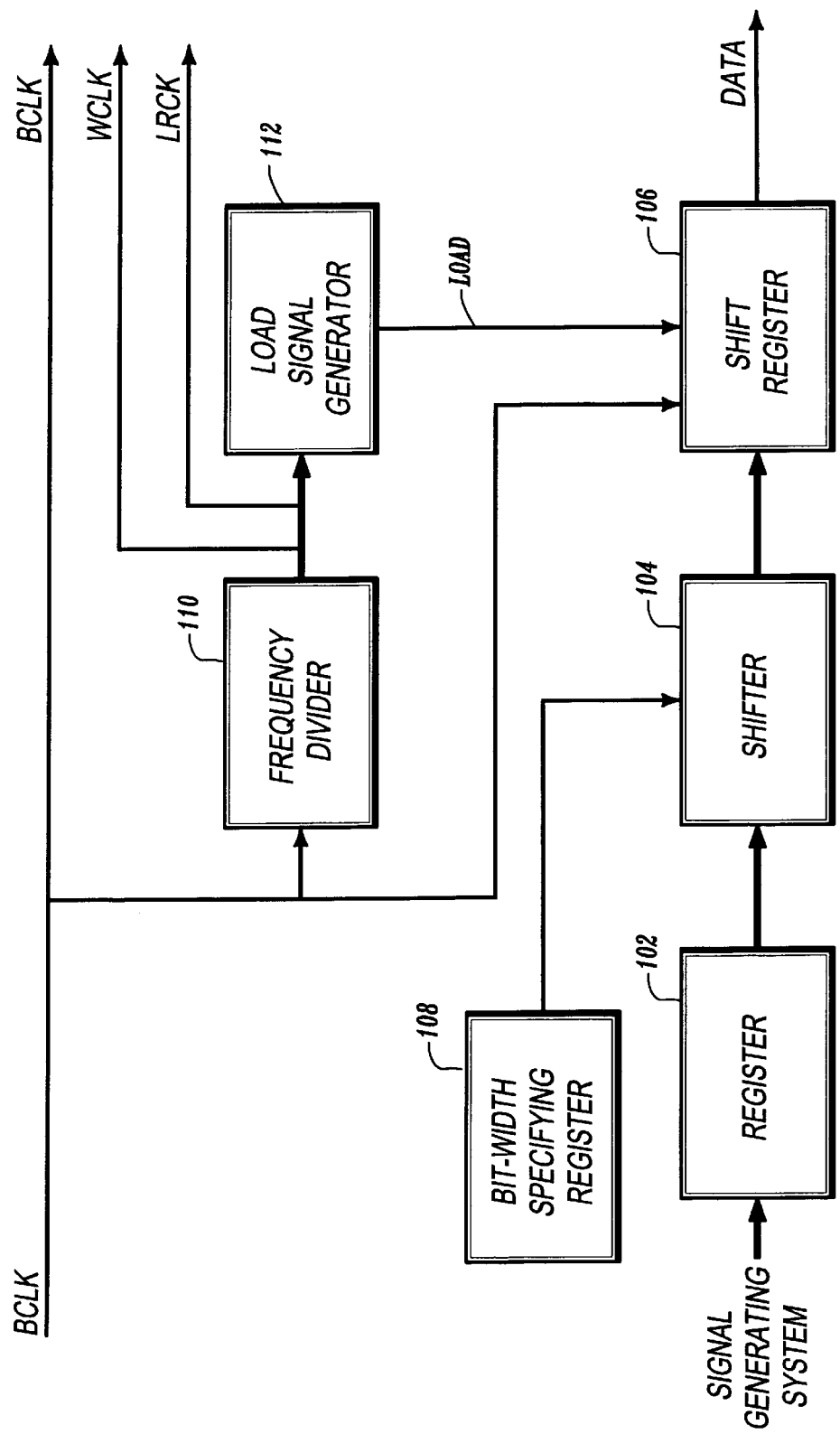
FIG. 1 is a block diagram showing an arrangement of an interface circuit for a serial D-A converter in the related art.
Figure 2:
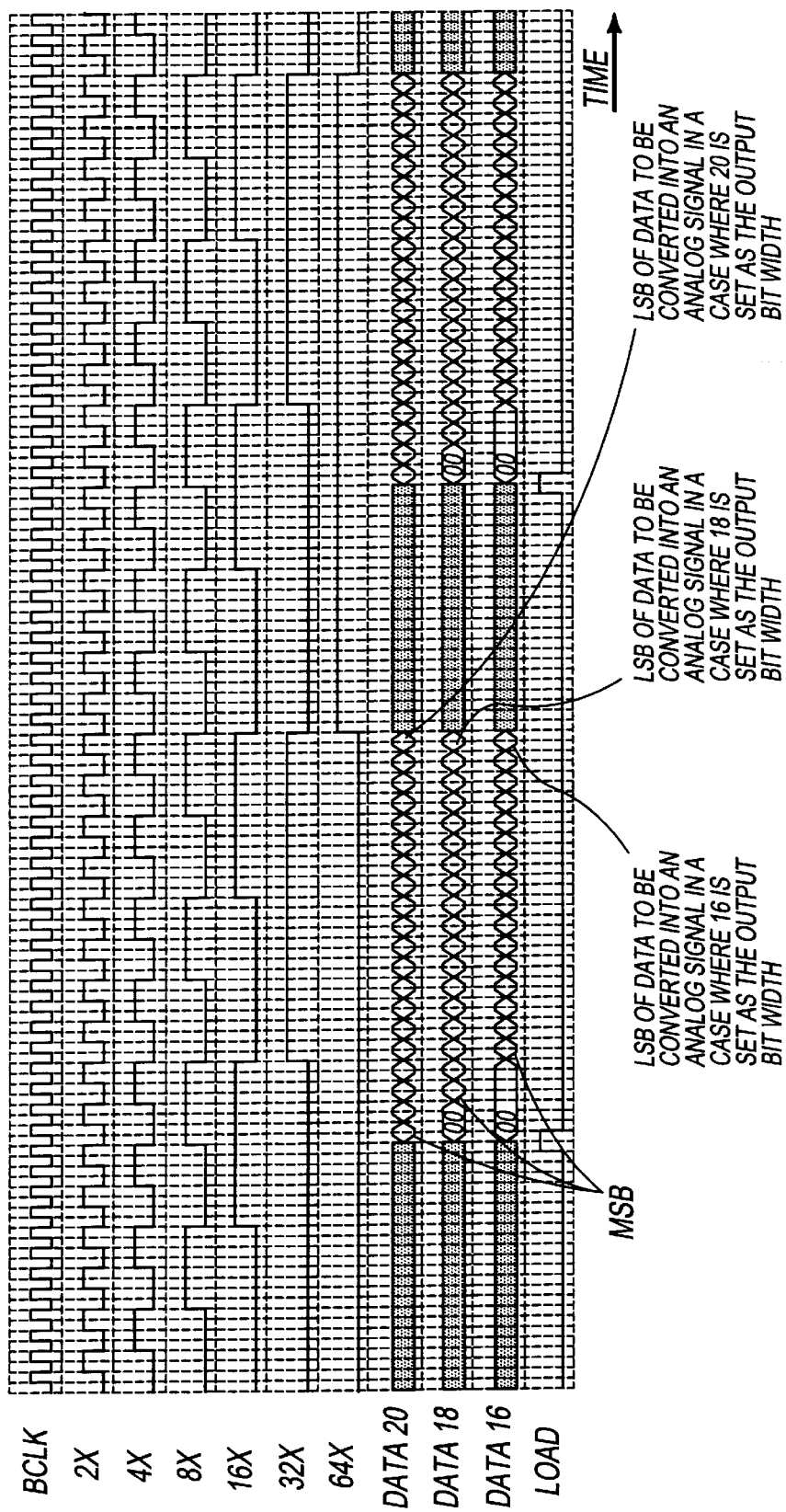
FIG. 2 is a timing chart showing operations of the interface circuit for a serial D-A converter in the related art.
Figure 3:
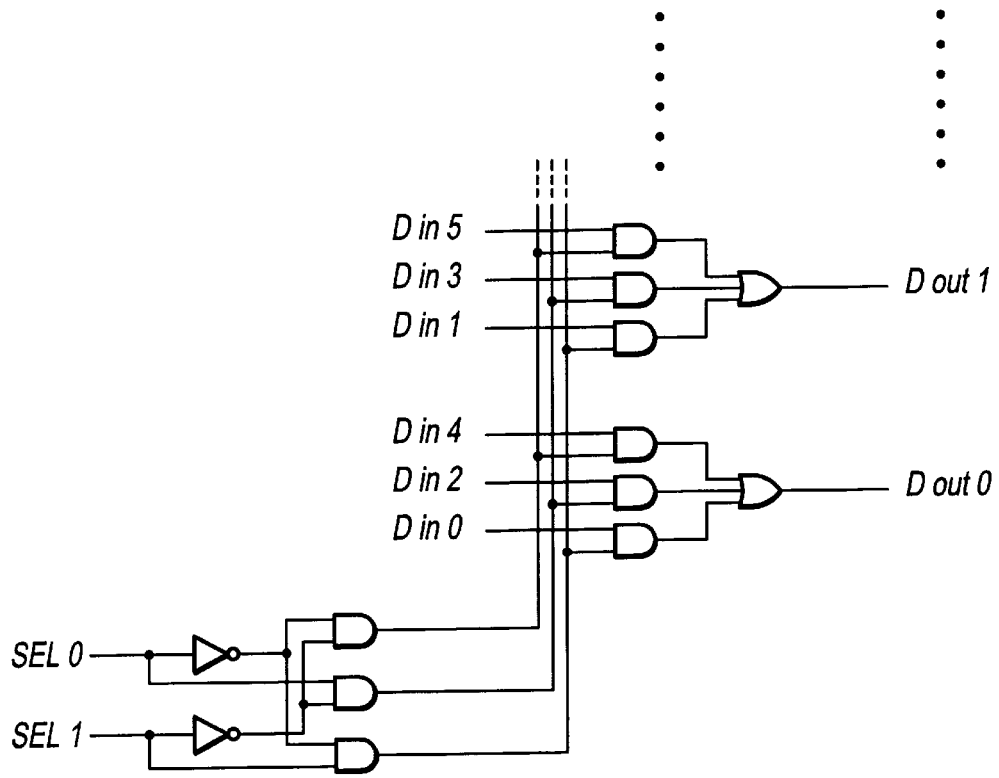
FIG. 3A shows an arrangement of a shifter in the interface circuit for a serial D-A converter in the related art.
FIG. 3B shows values of selecting signals set for values set as an output bit width.
Figure 5:
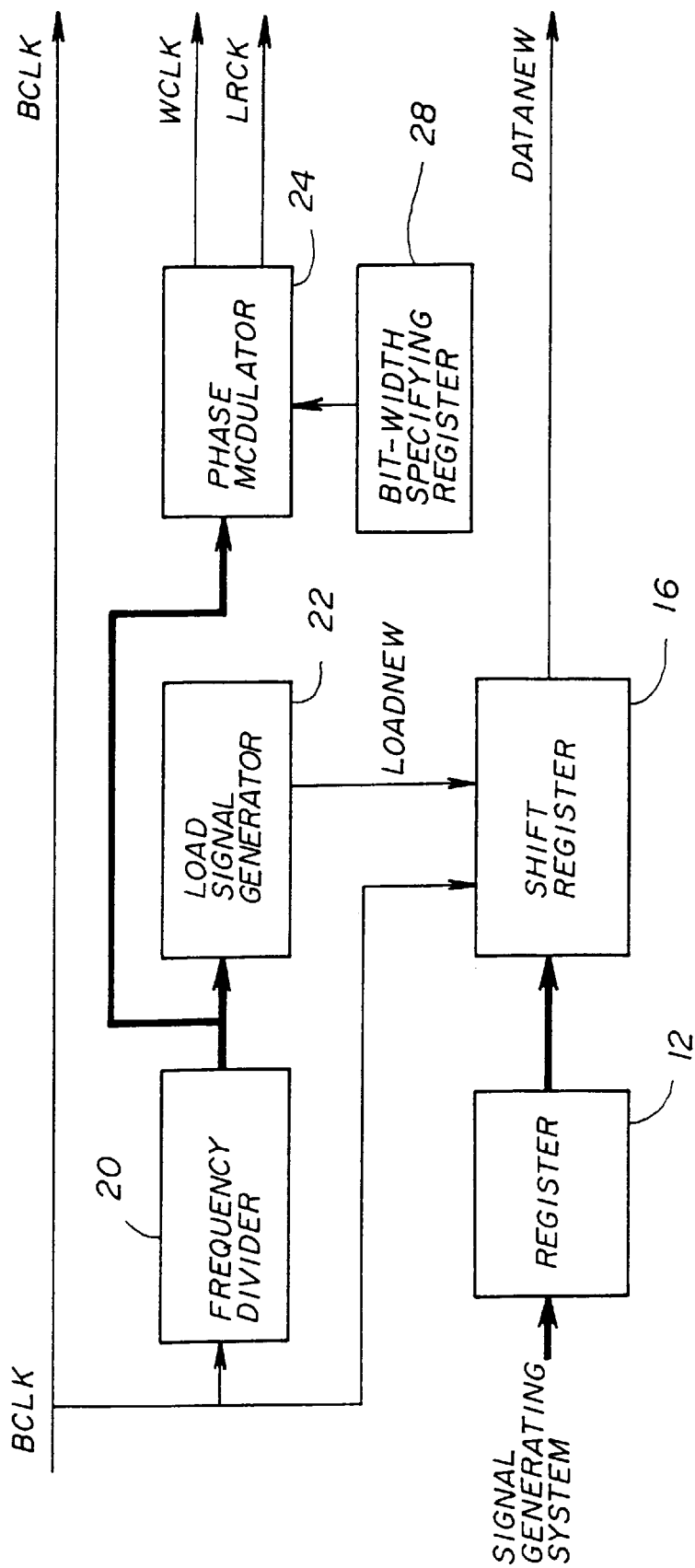
FIG. 5 is a block diagram showing an arrangement of an interface circuit for a serial D-A converter according to one embodiment of the present invention.

An interface circuit, according to one embodiment of the present invention, to be provided at the input side of the serial D-A converter, enables adjustment of the number of bits per piece of the serial data output from the interface circuit and converted into analog data through the serial D-A converter, using the above-described characteristics of the input format of the serial D-A converter. This interface circuit has the arrangement shown in FIG. 5. Specifically, this interface circuit includes, similar to the arrangement of the related art shown in FIG. 1, a register 12 for temporarily storing the parallel data supplied from the signal generating system, a shift register 16 for converting the parallel data into the serial data, a frequency divider 20 for performing frequency division on the bit clock signal BCLK, a load signal generator 22 for generating a load signal LOADNEW using signals obtained as a result of the bit clock signal BCLK undergoing frequency division performed by the frequency divider 20, and a bit-width specifying register 28 for specifying the output bit width. However, this interface circuit does not include the shifter. Further, in this interface circuit, a phase modulator 24 generates the word clock signal WCLK and the LR clock signal LRCK, which are the control signals for the serial D-A converter, based on the value set in the bit-width specifying register 28, using signals obtained as a result of the bit clock signal BCLK undergoing frequency division performed by the frequency divider 20.

Figure 6:
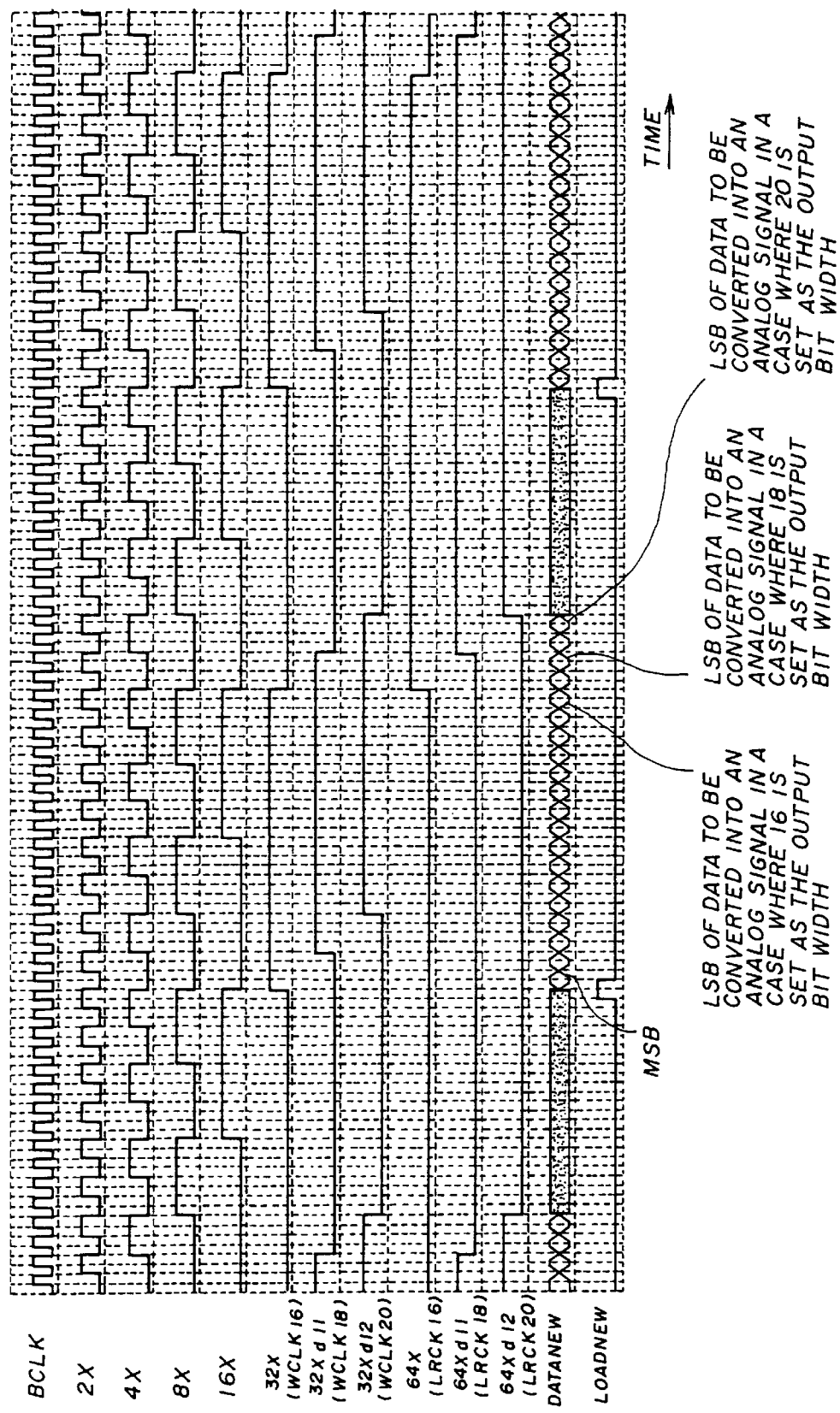
FIG. 6 is a timing chart showing operations of the interface circuit for a serial D-A converter in the embodiment of the present invention.

FIG. 6 shows a timing chart indicating operations of the above-described interface circuit according to the embodiment of the present invention. The frequency divider 20 performs frequency division on the bit clock signal BCLK and generates the twice signal '2×', four-times signal '4×', . . . , 64-times signal '64×'. Based on the value set in the bit-width specifying register 28, the phase modulator 24 outputs, as the word clock signal WCLK, one of the signals ('32×d12', '32×d11'), obtained as a result of the 32-times signal '32×' being delayed in accordance with the value set in the bit-width specifying register 28, and the 32-times signal '32×' itself. Based on the value set in the bit-width specifying register 28, the phase modulator 24 also outputs, as the LR clock signal LRCK, one of the signals ('64×d12', '64×d11'), obtained as a result of the 64-times signal '64×' being delayed in accordance with the value set in the bit-width specifying register 28, and the 64-times signal '64×' itself.

In the interface circuit according to the embodiment of the present invention, the number of bits per piece of the serial data to be output is fixed to be the maximum value, '20' without regard to the value set in the bit-width specifying register 28 or the set value for the output bit width. However, as described above, in the serial D-A converter, the bits input from the time at which the MSB of each word is input through the time of the subsequent change in level of the LR clock signal LRCK or the word clock signal WCLK (in the case of using the word clock WCLK, the subsequent decaying edge of the signal whereas, in the case of using the LR signal LRCK, either of the subsequent rising edge and the subsequent decaying edge of the signal) are determined to be effective (to be converted into. an analog signal through the serial D-A converter). The bits input to the serial D-A converter from the time immediately after the change in level of the LR clock signal LRCK or the word clock signal WCLK through the time immediately before the MSB of the subsequent word is input are not determined to be effective. Therefore, by changing the phase of the LR clock signal LRCK or the word clock signal WCLK in accordance with the value set in the bit-width setting register 28, it is possible to change the number of bits per piece of data, that is, the number of bits constituting one word, to be converted into an analog signal through the serial D-A converter. Thus, it is possible to substantially adjust the output bit width of the interface circuit in accordance with the value set in the bit-width setting register 28.

The interface circuit according to the embodiment of the present invention controls the phase of the LR clock signal LRCK and the phase of the word clock signal WCLK, which are the control signals for the serial D-A converter in order to adjust the output bit width. Operations and an arrangement for controlling the phases of the control signals will now be described.

In the related art, the 32-times signal '32×' and the 64-times signal '64×' of the signals obtained as a result of the bit clock signal BCLK undergoing frequency division performed by the frequency divider 20, as they are, are output as the word clock signal WCLK and as the LR clock signal LRCK, respectively. According to the embodiment of the present invention, by latching the 32-times signal '32×' and the 64-times signal '64×' at the time of each rising edge of the four-times signal '4×' or the 8-times signal '8×', it is possible to delay the phases of the 32-times signal '32×' and the 64-times signal '64×' by 2 bits or 4 bits of the bit clock signal BCLK, respectively. In the interface circuit according to the embodiment of the present invention, the timing of outputting of the effective data of the signal DATANEW is set such that the serial data in which one word is constituted by 20 bits is output in a case where the signal '32×d12' or '64×d12', which is obtained as a result of the 32-times signal '32×' or the 64-times signal '64×' being delayed by the 4 bits of the bit clock signal BCLK, is used as the word clock signal WCLK or the LR clock signal LRCK. When '20' is specified as the output bit width by the bit-width specifying register 28, the phase modulator 24 outputs, as the word clock signal WCLK20 and the LR clock signal LRCK20, the 32-times signal '32×d12' and the 64-times signal '64×d12' obtained as a result of the 32-times signal '32×' and the 64-times signal '64×' being delayed by 4 bits of the bit clock signal BCLK, respectively. When '18' is specified as the output bit width by the bit-width specifying register 28, the phase modulator 24 outputs, as the word clock signal WCLK18 and the LR clock signal LRCK18, the 32-times signal '32×d11' and the 64-times signal '64×d11' obtained as a result of the 32-times signal '32×' and the 64-times signal '64×' being delayed by 2 bits of the bit clock signal BCLK, respectively. When '16' is specified as the output bit width by the bit-width specifying register 28, the phase modulator 24 outputs, as the word clock signal WCLK16 and the LR clock signal LRCK16, the 32-times signal '32×' and the 64-times signal '64×', as they are, respectively. In the above, when the output bit width is 'i', the word clock signal is represented by 'WCLKi' and the LR clock signal is represented by 'LRCKi'.

Figure 7:
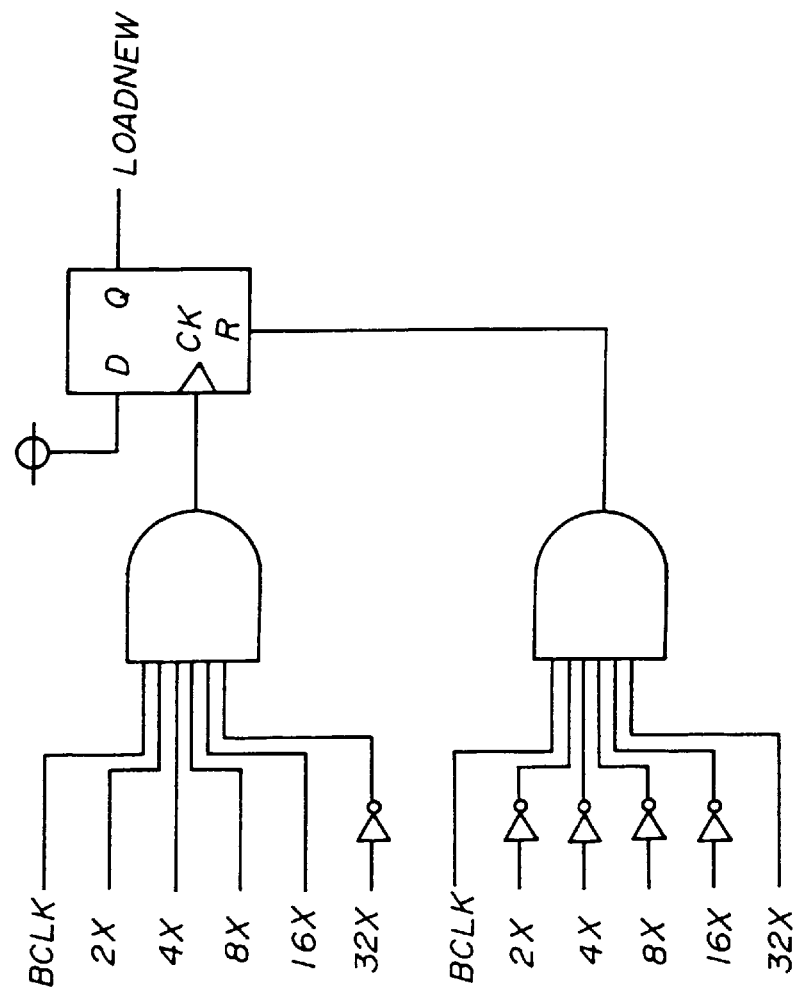
FIG. 7 is a circuit diagram of a load signal generator in the interface circuit for a serial D-A converter according to the present invention.

In order to set the timing of outputting the effective data of the signal DATANEW as mentioned above, it is necessary to generate the load signal LOADNEW shown in FIG. 6. This load signal can be generated by using the load signal generator 22 including AND gates and a D-flip-flop shown in FIG. 7. In this load signal generator, the Q-output of the D-flip-flop becomes '1' at each rising edge of the signal of the logical product of the bit clock signal BCLK, the twice signal '2×', the four-times signal '4×', the 8-times signal '8×', and the 16-times signal '16×' and the signal obtained as result of the 32-times signal '32×' being inverted. The D-flip-flop is reset so that the Q-output thereof becomes '0' at the subsequent rising edge of the signal of the logical product of the bit clock signal BCLK, the signal obtained as a result of the twice signal '2×' being inverted, the signal obtained as a result of the four-times signal '4×' being inverted, the signal obtained as result of the 8-times signal '8×' being inverted, the signal obtained as a result of the 16-times signal '16×' being inverted and the 32-times signal '32×'. Thereby, the load signal LOADNEW shown in FIG. 6 is obtained.

Figure 8A:
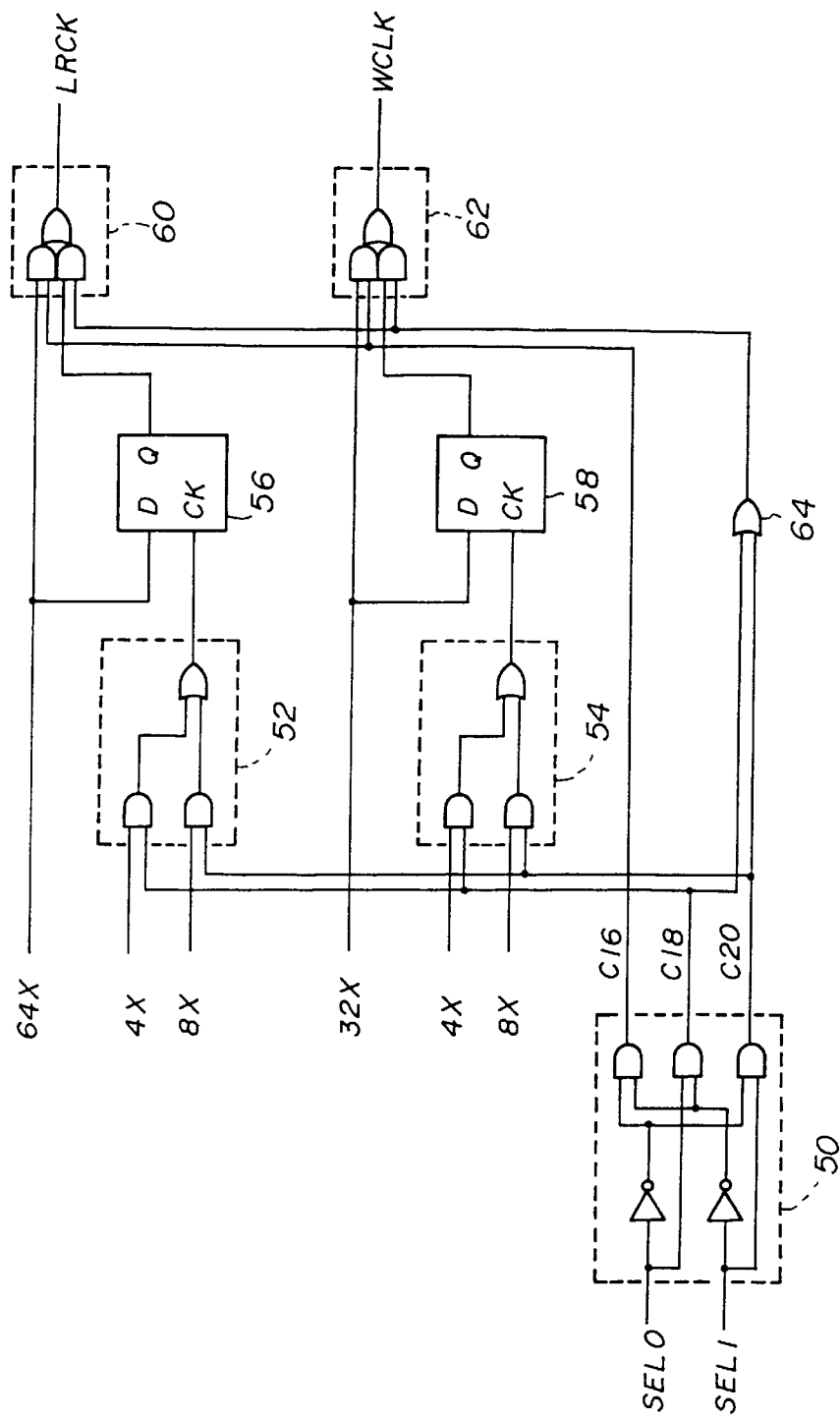
FIG. 8A shows an arrangement of a phase modulator in the interface circuit for a serial D-A converter according to the embodiment of the present invention.

The above-described word clock signal WCLK and the LR clock signal LRCK, the phases of which are controlled in accordance with the output bit width specified by the bit-width specifying register 28, can be generated by the phase modulator 24 having the arrangement shown in FIG. 8A. This phase modulator 24 includes a decoder 50 including AND gates and inverters, selectors 52, 54, 60 and 62 each including AND gates and an OR gate, D-flip-flops 56, 58, and an OR gate 64. The decoder 50 has selecting signals SEL0 and SEL1 input thereto, and generates signals C16, C18 and C20 as decoded results. The selecting signals SEL0 and SEL1 have values in accordance with the value set in the bit-width specifying register 28. Each of the signals C16, C18 and C20 corresponds to a respective one of the values set as the output bit width. The signals C16, C18 and C20 have the value '1' only when '16', '18' and '20' are set as the output bit width, respectively. Using the signals C16, C18 and C20 which are the decoded results, each of the selectors 52 and 54 selects one of the 4-times signal '4×' and the 8-times signal '8×'. The thus-selected signal is input, as a clock signal, to a respective one of the D-flip-flops 56 and 58. The 64-times signal '64×' is input to the D-input of the D-flip-flop 56 whereas the 32-times signal '32×' is input to the D-input of the D-flip-flop 58. Thereby, the Q-output of the D-flip-flop 56 is the signal obtained as a result of the 64-times signal '64×' being delayed by 2 periods or 4 periods of the bit clock signal BCLK in accordance with the value set as the output bit width (the bit width specified by the bit-width specifying register 28). The Q-output of the D-flip-flop 58 is the signal obtained as a result of the 32-times signal '32×' being delayed by 2 periods or 4 periods of the bit clock signal BCLK in accordance with the value set as the output bit width. The selector 60 has the Q-output of the D-flip-flop 56 and the 64-times signal '64×' input thereto, and outputs one of these input signals as the LR clock signal LRCK in accordance with the signals C16, C18 and C20 which are the decoded results. The selector 62 has the Q-output of the D-flip-flop 58 and the 32-times signal '32×' input thereto, and outputs one of these input signals as the word clock signal WCLK in accordance with the signals C16, C18 and C20 which are the decoded results. The values of the selecting signals SEL0 and SEL1 are set for the values set as the output bit width as shown in FIG. 8B. Thereby, the 64-times signal '64×d12' obtained as a result of the 64-times signal '64×' being delayed by 4 bits and the 32-times signal '32×d12' obtained as a result of the 32-times signal '32×' being delayed by 4 bits are output as the LR clock signal LRCK and the word clock signal WCLK, respectively, in the case where '20' is set as the output bit width. The 64-times signal '64×d11' obtained as a result of the 64-times signal '64×' being delayed by 2 bits and the 32-times signal '32×d11' obtained as a result of the 32-times signal '32×' being delayed by 2 bits are output as the LR clock signal LRCK and the word clock signal WCLK, respectively, in the case where '18' is set as the output bit width. The 64-times signal '64×' and the 32-times signal '32×' themselves are output as the LR clock signal LRCK and the word clock signal WCLK, respectively, in the case where '16' is set as the output bit width. (See FIG. 6.)

Thus, according to the embodiment of the present invention, as shown in FIG. 6, the phases of the word clock signal WCLK and LR clock signal LRCK, which are the control signals to the serial D-A converter, are changed in accordance with the value set in the bit-width specifying register 28. Thereby, the output bit width is substantially adjusted. As a result, the shifter for adjusting the output bit width is not needed, and thereby, the arrangement of the interface circuit is simple. Further, according to the embodiment of the present invention, as shown in FIG. 8A, the control of the above-mentioned phases for substantially controlling the output bit width can be performed in the simple arrangement using the signals obtained as a result of the bit clock signal BCLK undergoing frequency division performed by the frequency divider 20.

The present invention is not limited to the above-described embodiment, and variations and modifications may be made without departing from the scope of the present invention.

The contents of the basic Japanese Patent Application No.9-171587, filed on Jun. 27, 1997, are hereby incorporated by reference.

What is claimed is:

1. An interface circuit for a serial D-A converter, said serial D-A converter having a digital signal in a form of serial data input thereto and determining a piece of data of the digital signal in the form of serial data defined by a point of a change of a control signal as data to be converted into an analog signal, said interface circuit comprising:

a converting portion for converting an input digital signal in a form of parallel data into the digital signal in the form of serial data to be input to said serial D-A converter;

a specifying portion for specifying the number of bits per piece of the data of the digital signal in the form of serial data, the piece of the data of the digital signal in the form of serial data being data to be converted into the analog data by the serial D-A converter; and a phase control portion for changing the phase of the control signal in accordance with the number of bits specified by said specifying portion.

2. The interface circuit according to claim 1, further comprising a frequency dividing portion performing frequency division on a bit clock signal so as to generate at least one signal, said phase control portion changing the phase of the control signal, using the at least one signal obtained as a result of the bit clock signal undergoing frequency division performed by said frequency dividing portion, based on the number of bits specified by said specifying portion.

3. The interface circuit according to claim 2, wherein:

said frequency dividing portion generates at least one long-period clock signal and at least one short-period clock signal, half of the period of the at least one short-period clock signal corresponding to the number of bits specified by said specifying portion; and said phase control portion latches the at least one long-period clock signal at an edge of the at least one short-period clock signal so as to generate the control signal, the phase of the control signal being delayed by the half of the period of the at least one short-period clock signal, the thus-generated control signal being supplied to the serial D-A converter.

4. An interface circuit for a serial D-A converter, said serial D-A converter having a digital signal in a form of serial data input thereto and determining a piece of data of the digital signal in the form of serial data defined by a point of change of a control signal as data to be converted into an analog signal, said interface circuit comprising:

converting means for converting an input digital signal in a form of parallel data into the digital signal in the form of serial data to be input to said serial D-A converter;

specifying means for specifying the number of bits per piece of the data of the digital signal in the form of serial data, the piece of the data of the digital signal in the form of serial data being data to be converted into the analog data by the serial D-A converter; and phase control means for changing the phase of the control signal in accordance with the number of bits specified by said specifying means.

5. The interface circuit according to claim 4, further comprising frequency dividing means for performing frequency division on a bit clock signal so as to generate at least one signal, said phase control means changing the phase of the control signal, using the at least one signal obtained as a result of the bit clock signal undergoing frequency division performed by said frequency dividing means, based on the number of bits specified by said specifying means.

6. The interface circuit according to claim 5, wherein:

said frequency dividing means generates at least one long-period clock signal and at least one short-period clock signal, half of the period of the at least one short-period clock signal corresponding to the number of bits specified by said specifying means; and said phase control means latches the at least one long-period clock signal at an edge of the at least one short-period clock signal so as to generate the control signal, the phase of the control signal being delayed by the half of the period of the at least one short-period clock signal, the thus-generated control signal being supplied to the serial D-A converter.

* * * * *